United States Patent
Hocheng et al.

(10) Patent No.: US 6,909,998 B2
(45) Date of Patent: Jun. 21, 2005

(54) IN-SITU MONITORING METHOD AND SYSTEM FOR MOLD DEFORMATION IN NANOIMPRINT

(76) Inventors: Hong Hocheng, No. 101, Sec. 2, Guanfu Rd., Hsinchu City 300 (TW); Chin Chung Nien, No. 195, Sec. 4, Jhongsing Rd., Jhudong Township, Hsinchu County 310 (TW)

( * ) Notice: Subject to any disclaimer, the term of this patent is extended or adjusted under 35 U.S.C. 154(b) by 35 days.

(21) Appl. No.: 10/665,191

(22) Filed: Sep. 16, 2003

(65) Prior Publication Data

US 2004/0249609 A1 Dec. 9, 2004

(30) Foreign Application Priority Data

Jun. 2, 2003 (TW) .................................. 92114912 A

(51) Int. Cl.[7] .............................................. H01L 21/31
(52) U.S. Cl. .............................. 702/189; 702/32; 430/5; 430/30; 216/44; 216/52
(58) Field of Search ........................... 702/189, 32, 22; 430/30, 5, 17, 22, 272.1, 275.1, 302, 320; 216/44, 52, 53

(56) References Cited

U.S. PATENT DOCUMENTS

| | | | |
|---|---|---|---|
| 5,772,905 A | 6/1998 | Chou | 215/44 |
| 6,309,580 B1 | 10/2001 | Chou | 264/338 |
| 6,696,220 B2 * | 2/2004 | Bailey et al. | 430/272.1 |
| 2004/0188381 A1 * | 9/2004 | Sreenivasan | 216/40 |

* cited by examiner

*Primary Examiner*—John Barlow
*Assistant Examiner*—Hien Vo

(57) ABSTRACT

The present invention provides a method for in-situ real-time monitoring of mold deformation by using a database to store temporary information during the following steps: (a) providing a mark on the mold body that is easy to observe in order to monitor the mold deformation, (b) installing a signal source and a monitor device for monitoring the deformation quantity on the mold, (c) transforming the above deformation quantity into computer signals for storing in the database and (d) issuing controlling or warning signals to the imprinting machine based on the processing results of the stored information in the database.

34 Claims, 6 Drawing Sheets

IN-SITU MONITORING METHOD AND SYSTEM FOR MOLD DEFORMATION IN NANOIMPRINT

FIELD OF THE INVENTION

This invention relates to nanoimprint, and more particular to a method and a system for in-situ monitoring of mold deformation in a nanoimprint process by marking on the mold and monitoring the deformation of the mark.

BACKGROUND OF THE INVENTION

With the progress of nano-technology, more and more materials are processed at the nano or even molecular scale. Micro-contact printing, scanning probe-based technique and nanoimprint are among the most commonly used technologies.

As described above, the nanoimprint is considered the most potential to achieve manufacturing ultra large-scale integrated (ULSI) nano systems with low cost and high yield rate. The nanoimprint technology has the advantage of using a single step to transfer the same nano pattern and manufacture nano structure on a large area chip substurate with a single mold. This technology is widely used in manufacturing nano electronics, optical components, high-density storage devices, nano electromagnetic devices, biological devices, and nano electromechanical components.

However, the nanoimprint technology is yet mostly a laboratory prototype for research purposes despite its advantages and potential. A commercially viable machine is not available because the technology still faces many pending problems, including the alignment in multi-layer component manufacturing, the large size molds accompanying high yield rate, the molds with high density patterns, mold sticking, solidification of polymer, mold life span and imprinting temperature and pressure, and the quality and the standardized verification of final products. As described above, the improvement of the yield rate is the key factor for the commercialization of nanoimprint technology.

In the nanoimprint process, it requires a high imprinting speed to achieve a high yield rate. At such a high imprinting speed, the uniformity and precision of imprinted micro and nano scale structure and components will be lost if the mold is deformed. In addition, if deformation of the mold is not caught by the production operators in time, a lot of defected products will be produced, and the yield rate suffers.

Conventional technologies use dynamic computational methods to construct theoretical prediction model of micro components in order to determine the mold deformation. Based on the prediction model, a simulation of micro deformation of the mold is obtained. However, because of the difference between the ideal boundary conditions and the real boundary conditions, the simulation is unable to provide practical information. Further more, when the automatic manufacturing process needs the online real-time mold deformation information for judgment, the simulated deformation of mold is not applicable.

SUMMARY OF THE INVENTION

The objective of the present invention is to provide real-time accurate measurement of the mold deformation in nanoimprint, in order to develop an online real-time detection method for mold deformation based on direct quantitative measurement and observation. With this method, the mold deformation is controlled within the precision of a nano scale, in order to provide a basis for high-yield rate automatic manufacturing process.

In the nanoimprint process, the mold is deformed due to the subsequent imprinting pressure, repetitive uses, or other external factors. The deformation of the mold also causes the deformation of the marks on the mold body. Therefore, to achieve the aforementioned objective, the present invention provides a method for in-situ monitoring of mold deformation by using a database to store temporary information during the following steps: (a) providing a mark on the mold body that is easy to observe in order to monitor the mold deformation, (b) installing a signal source and a monitor device for monitoring the micro and nano deformation quantity on the mold, (c) transforming the above deformation quantity into computer signals for storing in the database and (d) issuing controlling or warning signals to the imprinting machine based on the processing results of the stored information in the database.

The present invention will become more obvious from the following descriptions when taken in connection with the accompanying drawings which show, for purposes of illustration only, a preferred embodiment in accordance with the present invention.

DETAILED DESCRIPTION OF THE PREFERRED EMBODIMENTS

Figure 1:
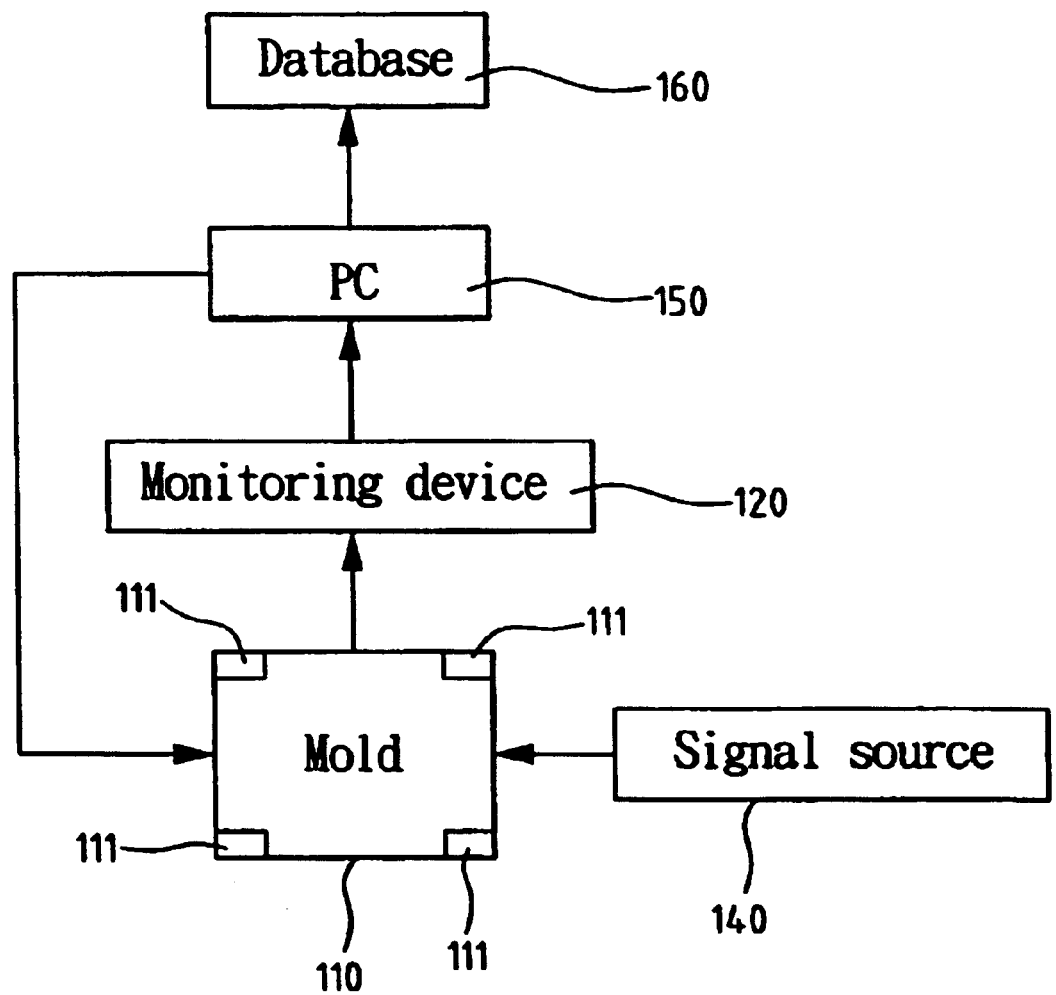
FIG. 1 shows a block diagram of a mold deformation monitoring system of the present invention.

FIG. 1 shows a system block diagram of the present invention. As shown in FIG. 1, the monitoring device 120 is installed around a mold 110 of a nanoimprint machine. The mold is marked with at least one monitoring mark 111 at appropriate location for monitoring mold deformation, and a signal source 140 is also installed around the mold 110. The signal, emitted from the signal source 140, is reflected by at least one of monitoring marks 111 on the mold 110, and received by the monitoring device 120. The signal received by the monitoring device 120 varies in accordance with the deformation quantity monitoring marks 111 on the mold 110. The monitoring device 120 transforms the signals into digital signals to personal computer 150, which processes the input digital signal, and stores the temporary information in the database 160. The signal source 140 is optical, electrical, magnetic or electromagnetic.

Figure 2:
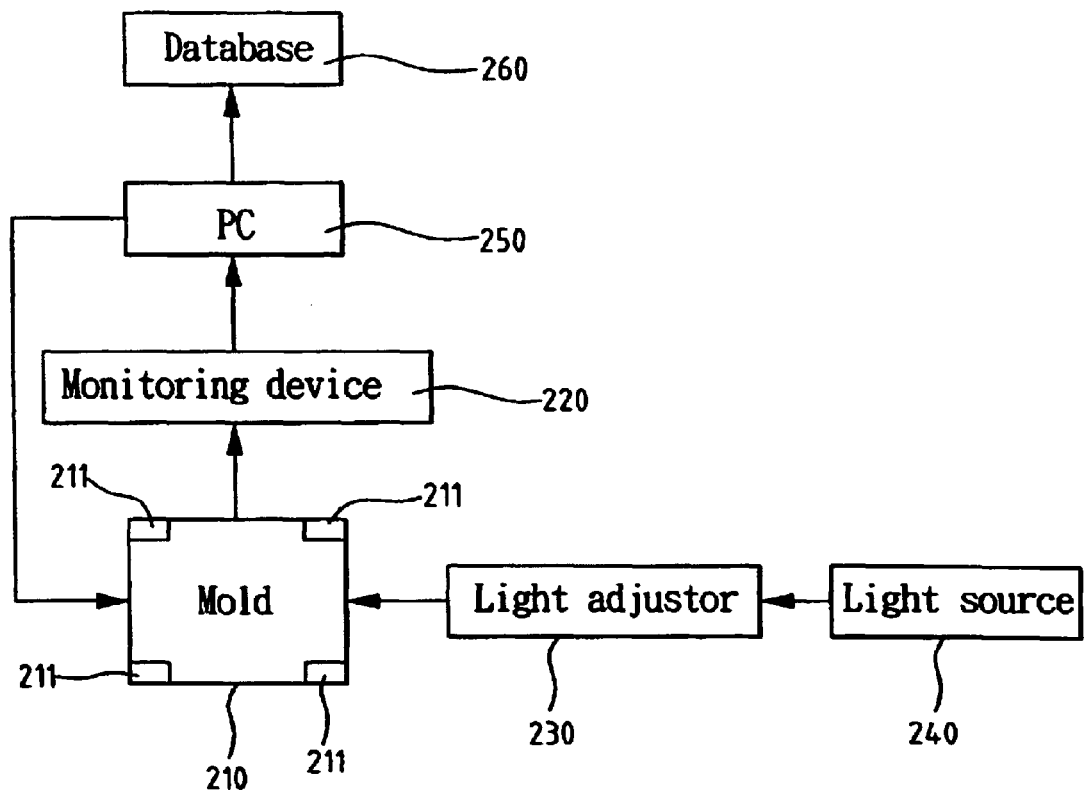
FIG. 2 shows a block diagram of a first embodiment of the present invention.

FIG. 2 shows a block diagram of a first embodiment of the present invention. As shown in FIG. 2, a monitoring device 220 is installed around a mold 210 of a nanoimprint machine. The mold 210 is marked with monitoring marks 211 for monitoring mold deformation, and a light source 240 is also installed around the mold 210. The light, emitted from the light source 240, is reflected by at least one of monitoring marks 211 on the mold 210, and received by the monitoring device 220. The light received by the monitoring device 220 varies in accordance with the deformation quantity monitoring marks 211 on the mold 210. The monitoring device 220 transforms the light into digital signals to personal computer 250, which processes the input digital signal, and stores the temporary information in the database 260. A light adjustor 230 is placed between the light source 240 and the mold 210 for adjusting the input light to the monitoring marks 211. The monitoring device 220 is an optical monitoring device.

Figure 3:
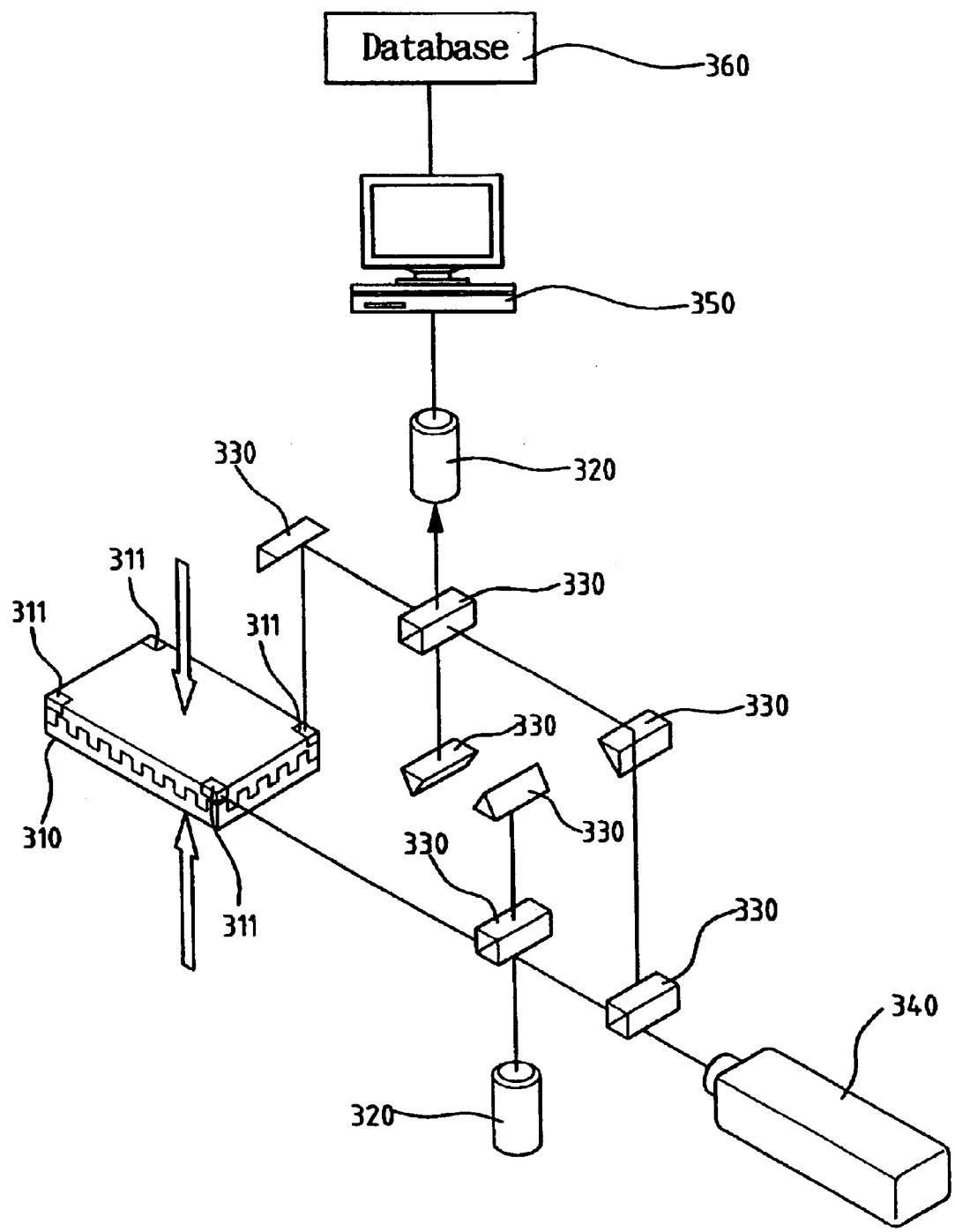
FIG. 3 shows a system diagram of a second embodiment of the present invention.

FIG. 3 shows a system diagram of a second embodiment of the present invention. As shown in FIG. 3, monitoring devices 320 are installed around a mold 310 of a nanoimprint machine. The mold 310 is marked with monitoring marks 311 for monitoring mold deformation, and laser sources 340 are also installed around the mold 310. The laser, emitted from the laser sources 340, is reflected by at least one of monitoring marks 311 on the mold 310, and received by the monitoring devices 320. The laser received by the monitoring device 320 varies in accordance with the deformation quantity monitoring marks 311 on the mold 310. The monitoring device 320 transforms the laser into digital signal to personal computer 350, which processes the input digital signal, and stores the temporary information in the database 360. A laser splitter 330 is placed between the laser source 340 and the mold 310 for adjusting the characteristics of the input laser to the monitoring marks 311. The monitoring marks 311 can be coated with an electroplated thin film of aluminum or other appropriate materials.

Figure 4:
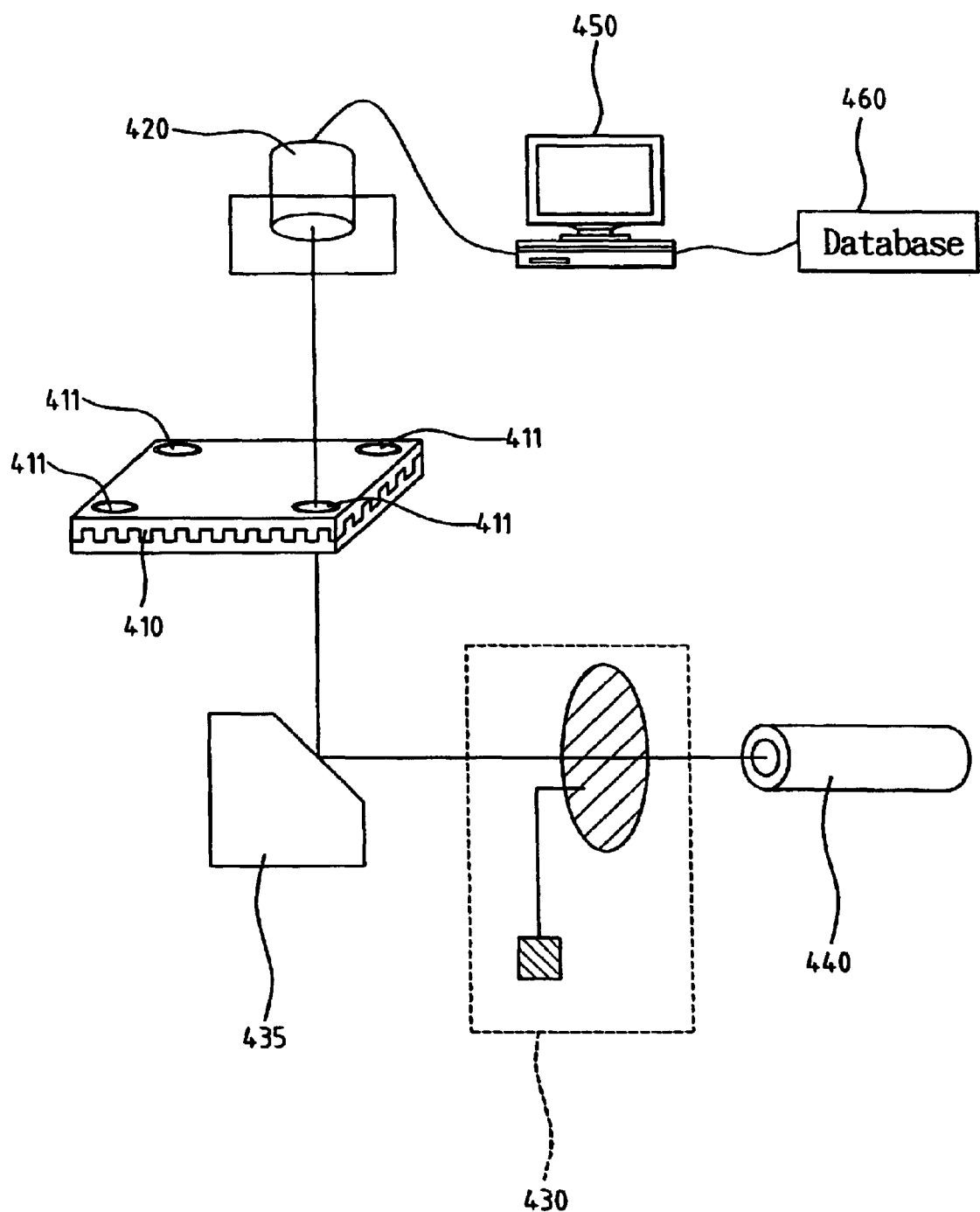
FIG. 4 shows a system diagram of a third embodiment of the present invention.

FIG. 4 shows a system diagram of a third embodiment of the present invention. As shown in FIG. 4, CCD monitoring devices 420 are installed around a mold 410 of a nanoimprint machine. The mold is marked with monitoring marks 411 for monitoring mold deformation, and light sources 440 are also installed around the mold 410. The light, emitted from the light sources 440, is reflected by at least one of monitoring marks 411 on the mold 410, and received by the CCD monitoring devices 420. The light received by the CCD monitoring device 420 varies in accordance with the deformation quantity monitoring marks 411 on the mold 410. The CCD monitoring devices 420 transform the light into digital signal to personal computer 450, which processes the input digital signal, and stores the temporary information in the database 460. An attenuator 430 and a reflector 435 are placed between the light source 440 and the mold 410 for adjusting the characteristics of the input light to the monitoring marks 411. The monitoring marks 411 are made of mirrors with high reflection, of which the surface is coated with an electroplated thin film of aluminum or other appropriate materials.

Figure 5:
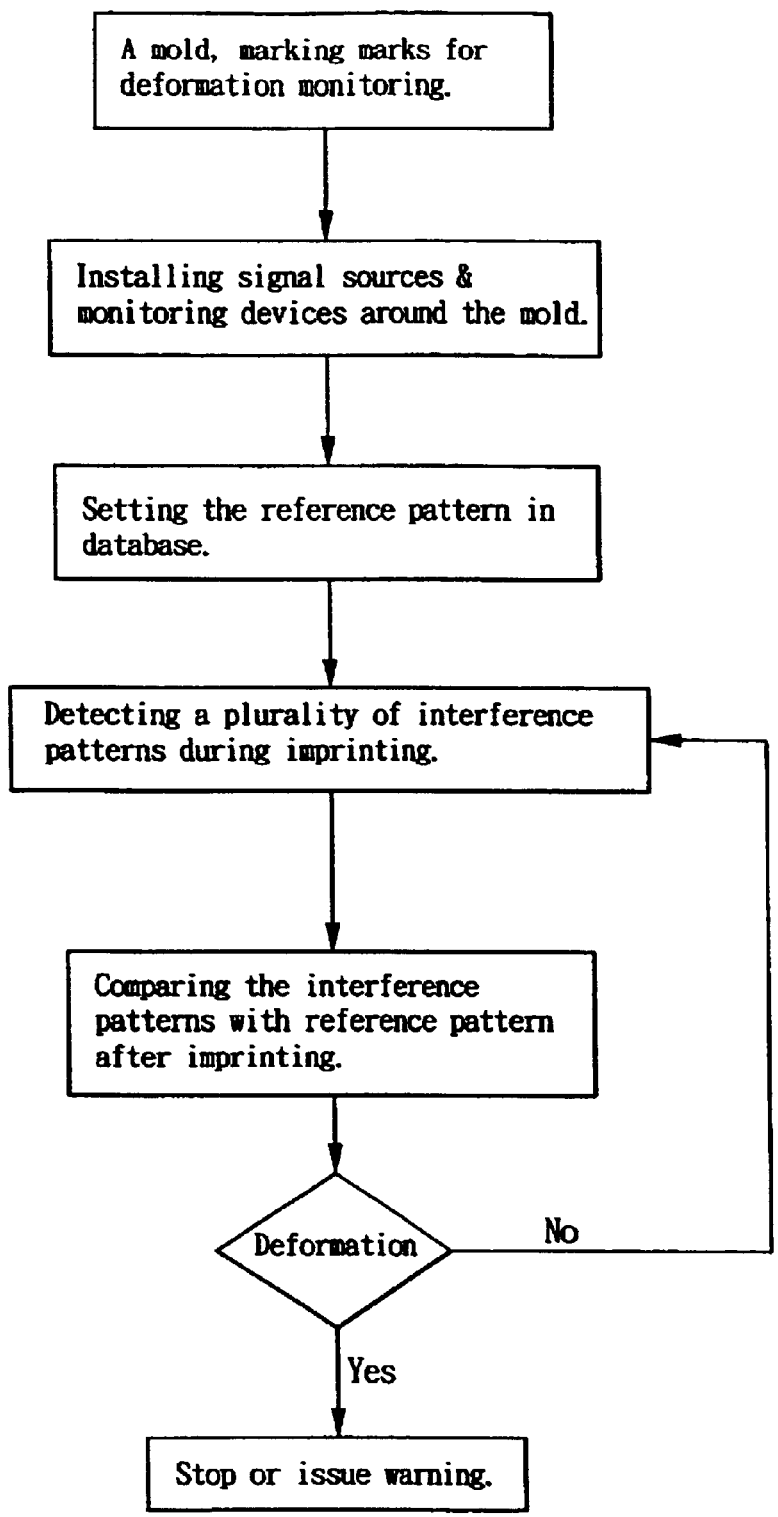
FIG. 5 shows a flowchart of mold deformation monitoring method of the present invention.

The present invention uses a database for storing temporary information. FIG. 5 shows a flowchart of the present invention. As shown in FIG. 5, the method comprises the steps of: (a) providing a mold, marking the mold with at least one monitoring mark for monitoring deformation, (b) installing at least one signal source and at least one monitoring device around the mold, (c) recording a reference pattern in the database before imprinting, the reference pattern is obtained by using the signal source to emit signals to the monitor marks, and using the monitoring device to receive the interference pattern reflected from the monitoring marks, and the interference pattern is recorded as the reference pattern, (d) detecting a plurality of interference patterns during the imprinting, the interference patterns are recorded in the database, (e) comparing the interference patterns during imprinting and the reference pattern and (f) stopping or issuing warning if the comparison showing a deformation, otherwise, continuing to monitor the imprinting.

The aforementioned mold with the monitoring marks is used in mold deformation monitoring and detection as well as imprinting.

Figure 6:
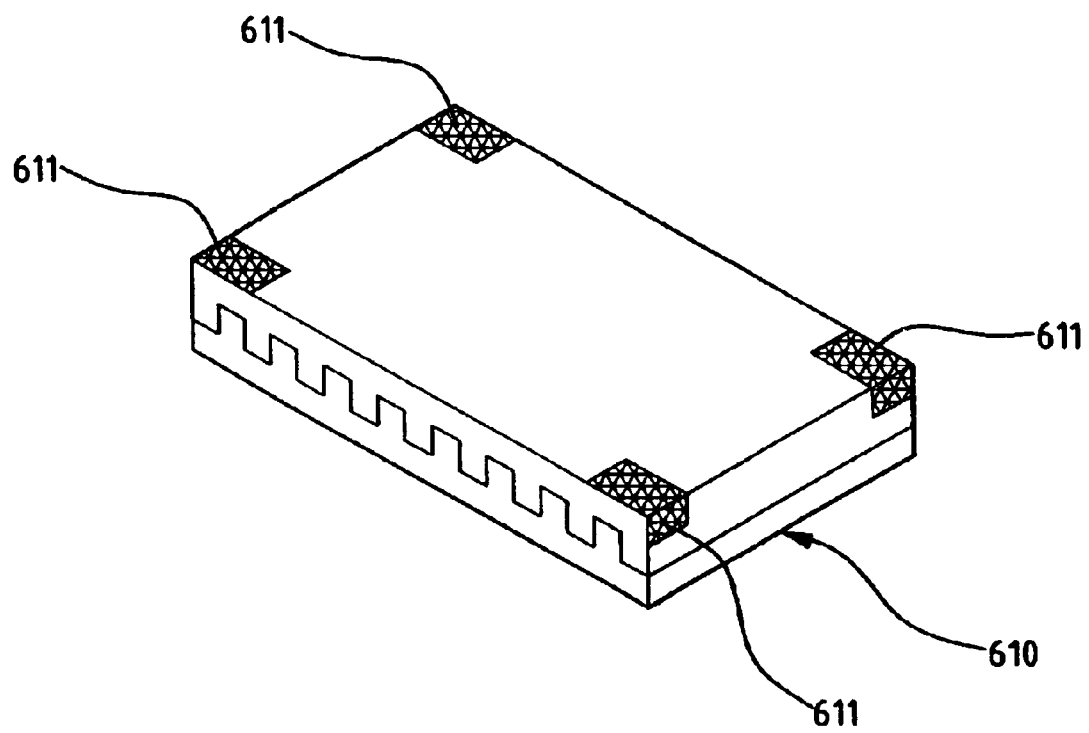
FIG. 6 shows an imprinting mold with a monitoring mark according to the present invention.

FIG. 6 shows an imprinting mold with monitoring marks in accordance with the present invention. As shown in FIG. 6, a mold 610 comprises at least one monitoring mark 611 for monitoring mold deformation. The monitoring marks are placed at any location on the mold 610.

While we have shown and described the embodiment in accordance with the present invention, it should be clear to those skilled in the art that further embodiments may be made without departing from the scope of the present invention.

What is claimed is:

1. An in-situ mold deformation monitoring method for nanoimprint, said method using a database for storing temporary information, and comprising the following steps of:
   (A) providing a mold, and marking said mold with at least one monitoring mark;
   (B) installing at least one monitoring device and at least one signal source around said mold;
   (C) recording a reference pattern in said database before imprinting, said reference pattern being obtained by using said signal source to issue signals to said monitoring marks, and using said monitoring device to receive interference pattern reflected by said monitoring marks, said interference pattern then being transformed into input signal to computers and recorded as said reference pattern in said database;
   (D) detecting a plurality of interference patterns during a complete imprinting step, transforming said interference patterns into input signals to computers, and recorded in said database;
   (E) comparing said interference patterns recorded in step (D) with said reference pattern record in step (C); and
   (F) issuing controlling signals based on the result of the comparison in step (E).

2. The method as claimed in claim 1, wherein said mold is a mold for micro and nano scale structures.

3. The method as claimed in claim 1, wherein said mold is a mold for manufacturing micro and nano scale patterns.

4. The method as claimed in claim 1, wherein said monitoring device is an optical monitoring device.

5. The method as claimed in claim 4, wherein said optical monitoring device is a CCD monitoring device.

6. The method as claimed in claim 1, wherein said signal source is optical signal.

7. The method as claimed in claim 6, wherein a light adjustor is placed between said optical signal source and said mold.

8. The method as claimed in claim 7, wherein said light adjustor is a light splitter.

9. The method as claimed in claim 7, wherein said light adjustor is a light attenuator.

10. The method as claimed in claim 6, wherein said optical signal source is a laser source.

11. The method as claimed in claim 1, wherein said signal source is electrical signal.

12. The method as claimed in claim 1, wherein said signal source is magnetic signal.

13. The method as claimed in claim 1, wherein said signal source is electromagnetic signal.

14. The method as claimed in claim 1, wherein said database is accessed and processed by a PC.

15. The method as claimed in claim 1, wherein said controlling signal is to stop operating the mold.

16. The method as claimed in claim 1, wherein said controlling signal is to cause the imprinting machine to issue warning.

17. The method as claimed in claim 1, wherein said controlling signal is to cause said monitoring device continuing the monitoring.

18. An in-situ monitoring system for mold deformation in nanoimprint, said system comprising:
- a mold, and at least one monitoring mark on said mold;
- at least one signal source, installed around said mold;
- at least one monitoring device, installed around said mold; and
- a database, for storing temporary information;
- comprising a program code for real-time detecting of said monitoring marks on said mold, and executing the following steps of:
  - (A) recording a reference pattern in said database before imprinting, said reference pattern being obtained by using said signal source to issue signals to said monitoring marks, and using said monitoring device to receive interference pattern reflected by said monitoring marks, said interference pattern then being transformed into input signal to computers and recorded as said reference pattern in said database;
  - (B) detecting a plurality of interference patterns during imprinting, transforming said interference patterns into input signals to computers, and recorded in said database;
  - (C) comparing said interference patterns recorded in step (B) with said reference pattern record in step (A); and
  - (D) issuing controlling signals based on the result of the comparison in step (C).

19. The system as claimed in claim 18, wherein said mold is a mold for micro and nano structures.

20. The system as claimed in claim 18, wherein said mold is a mold for manufacturing micro and nano scale patterns.

21. The system as claimed in claim 18, wherein said monitoring device is an optical monitoring device.

22. The system as claimed in claim 21, wherein said optical monitoring device is a CCD monitoring device.

23. The system as claimed in claim 18, wherein said signal source is optical signal.

24. The system as claimed in claim 23, wherein a light adjustor is placed between said optical signal source and said mold.

25. The system as claimed in claim 24, wherein said light adjustor is a light splitter.

26. The system as claimed in claim 24, wherein said light adjustor is a light attenuator.

27. The system as claimed in claim 23, wherein said optical signal source is a laser source.

28. The system as claimed in claim 18, wherein said signal source is electrical signal.

29. The system as claimed in claim 18, wherein said signal source is magnetic signal.

30. The system as claimed in claim 18, wherein said signal source is electromagnetic signal.

31. The system as claimed in claim 18, wherein said database is accessed and processed by a PC.

32. The system as claimed in claim 18, wherein said controlling signal is to stop operating the mold.

33. The system as claimed in claim 18, wherein said controlling signal is to cause the imprinting machine to issue warning.

34. The system as claimed in claim 18, wherein said controlling signal is to cause said monitoring device continuing the monitoring.

* * * * *